United States Patent
Sakui

(10) Patent No.: US 10,170,187 B2
(45) Date of Patent: Jan. 1, 2019

(54) APPARATUSES AND METHODS USING NEGATIVE VOLTAGES IN PART OF MEMORY WRITE READ, AND ERASE OPERATIONS

(75) Inventor: Koji Sakui, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 775 days.

(21) Appl. No.: 13/437,547

(22) Filed: Apr. 2, 2012

(65) Prior Publication Data

US 2013/0258785 A1 Oct. 3, 2013

(51) Int. Cl.
  *G11C 16/04* (2006.01)
  *G11C 16/34* (2006.01)

(52) U.S. Cl.
  CPC ...... *G11C 16/0483* (2013.01); *G11C 16/3418* (2013.01)

(58) Field of Classification Search
  CPC .......... G11C 16/0483; G11C 16/3418
  USPC ........... 365/185.17, 185.18, 185.29, 185.22, 365/185.27, 185.33; 257/314
  See application file for complete search history.

(56) References Cited

U.S. PATENT DOCUMENTS

| | | | |
|---|---|---|---|
| 6,426,894 B1* | 7/2002 | Hirano | G11C 16/10 365/185.18 |
| 7,075,828 B2 | 7/2006 | Lue et al. | |
| 7,130,215 B2* | 10/2006 | Yeh | 365/185.18 |
| 7,394,694 B2* | 7/2008 | Micheloni et al. | 365/185.17 |
| 7,633,803 B2* | 12/2009 | Lee | G11C 16/0483 365/185.17 |
| 7,764,544 B2 | 7/2010 | Mokhlesi | |
| 8,039,886 B2* | 10/2011 | Mizukami | G11C 16/0483 257/314 |
| 8,107,286 B2* | 1/2012 | Itagaki et al. | 365/185.17 |
| 8,787,085 B2* | 7/2014 | Widjaja | 365/185.17 |
| 8,917,554 B2* | 12/2014 | Toyama et al. | 365/185.18 |
| 9,064,577 B2* | 6/2015 | Zhao | G11C 16/0483 |
| 2010/0034019 A1 | 2/2010 | Kang et al. | |
| 2011/0085385 A1 | 4/2011 | Park et al. | |

FOREIGN PATENT DOCUMENTS

JP  3-171758 A  7/1991

* cited by examiner

*Primary Examiner* — Alexander Sofocleous
*Assistant Examiner* — Alfredo Bermudez Lozada
(74) *Attorney, Agent, or Firm* — Schwegman Lundberg & Woessner, P.A.

(57) ABSTRACT

Some embodiments include apparatuses and methods having a memory cell string that can include memory cells located in different levels of the apparatus. The memory cell string can include a body associated with the memory cells. At least one of such embodiments can include a module configured to apply a negative voltage to at least a portion of the body of the memory cell string during an operation of the apparatus. The operation can include a read operation, a write operation, or an erase operation. Other embodiments are described.

7 Claims, 16 Drawing Sheets

200

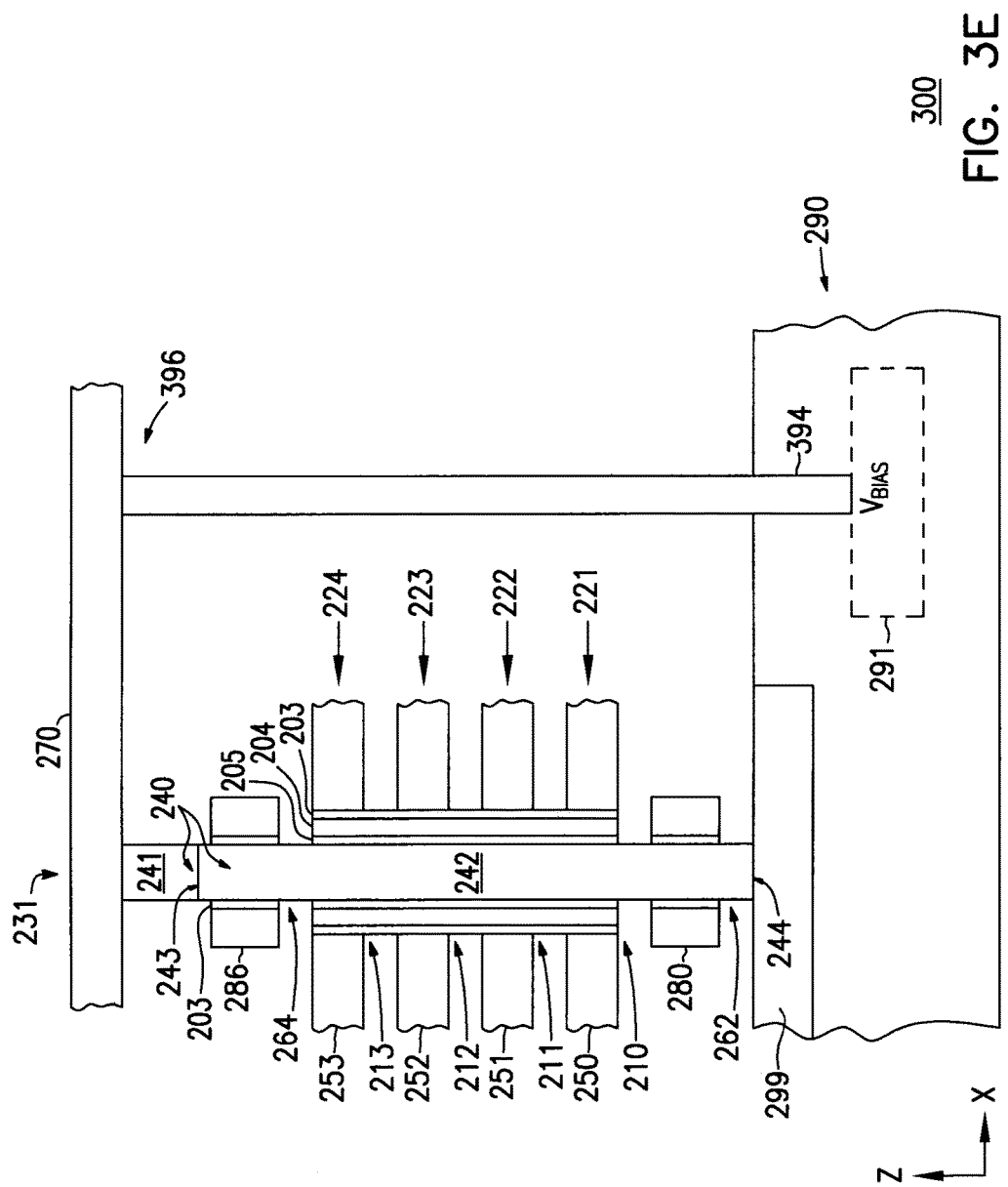

APPARATUSES AND METHODS USING NEGATIVE VOLTAGES IN PART OF MEMORY WRITE READ, AND ERASE OPERATIONS

BACKGROUND

Memory devices, such as flash memory, are widely used in computers and many electronic products. Such memory devices have numerous memory cells. Information can be stored in the memory cells in a write operation. The stored information can be obtained in a read operation or can be cleared in an erase operation. In some conventional memory devices, the read, write, and erase operations may generate excess carriers (e.g., holes) and cause them to accumulate in some active areas of the memory device. Such excess carriers may affect the reliability of these operations.

BRIEF DESCRIPTION OF THE DRAWINGS

FIG. 3E shows a variation of the memory device of FIG. 3D including a source line formed in a substrate, according to an embodiment of the invention.

DETAILED DESCRIPTION

Figure 1:
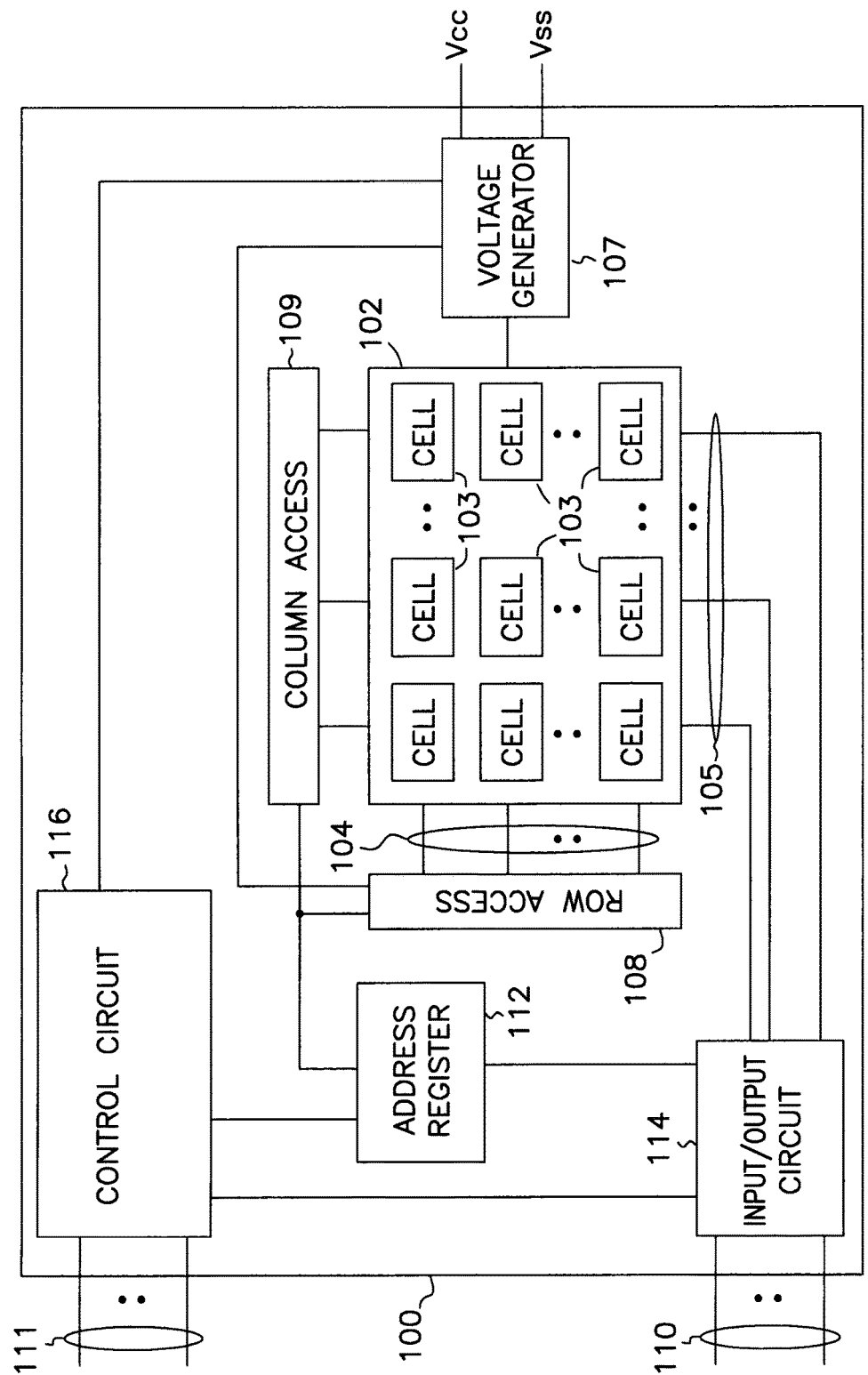
FIG. 1 shows a block diagram of an apparatus in the form of a memory device, according to an embodiment of the invention.

FIG. 1 shows a block diagram of an apparatus in the form of a memory device 100, according to an embodiment of the invention. Memory device 100 can include a memory array 102 having memory cells 103 that can be arranged in rows and columns along with lines (e.g., access lines) 104 and lines (e.g., data lines) 105. Memory device 100 can use lines 104 to access memory cells 103 and lines 105 to exchange information with memory cells 103.

Row access 108 and column access 109 circuitry can respond to an address register 112 to access memory cells 103 based on row address and column address signals on lines 110, 111, or both. A data input/output circuit 114 can be configured to exchange information between memory cells 103 and lines 110. Lines 110 and 111 can include nodes within memory device 100 or pins (or solder balls) on a package where memory device 100 can reside.

A control circuit 116 can control operations of memory device 100 based on signals present on lines 110 and 111. A device (e.g., a processor or a memory controller) external to memory device 100 can send different commands (e.g., read, write, or erase command) to memory device 100 using different combinations of signals on lines 110, 111, or both.

Memory device 100 can respond to commands to perform memory operations on memory cells 103, such as performing a read operation to read information from memory cells 103 or performing a write (e.g., programming) operation to store (e.g., program) information into memory cells 103. Memory device 100 can also perform an erase operation to erase information from some or all of memory cells 103.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry. Memory device 100 can include a voltage generator 107 to generate voltages for use in operations of memory device 100, such as read, write, and erase operations. Voltage generator 107 can include charge pumps, such as positive charge pumps (e.g., to provide pumped voltages having positive values) and negative charge pumps (e.g., to provide pumped voltage having negative values).

Each of memory cells 103 can be programmed to store information representing a value of a fraction of a bit, a value of a single bit, or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value for multiple bits, such as one of four possible values "00," "01," "10," and "11" of two bits, one of eight possible values "000," "001," "010," "011," "100," "101," "110," and "111" of three bits, or one of other values of another number of multiple bits. A cell that has the ability to store multiple bits is sometimes called a multi-level cell (or multi-state cell).

Memory device 100 can include a non-volatile memory device, and memory cells 103 can include non-volatile memory cells, such that memory cells 103 can retain information stored thereon when power (e.g., Vcc, Vss, or both) is disconnected from memory device 100. For example, memory device 100 can be a flash memory device, such as a NAND flash or a NOR flash memory device, or another kind of memory device, such as a variable resistance memory device (e.g., a phase change or resistive random access memory (RAM) device).

Memory device 100 can include a memory device where memory cells 103 can be physically located in multiple levels on the same device, such that some of memory cells 103 can be stacked over some other memory cells 103 in multiple levels over a substrate (e.g., a semiconductor substrate) of memory device 100.

One of ordinary skill in the art may recognize that memory device 100 may include other elements, several of which are not shown in FIG. 1, so as not to obscure the example embodiments described herein.

At least a portion of memory device 100 can include structures similar to or identical to memory devices described below with reference to FIG. 2A through FIG. 3B.

Figure 2A:
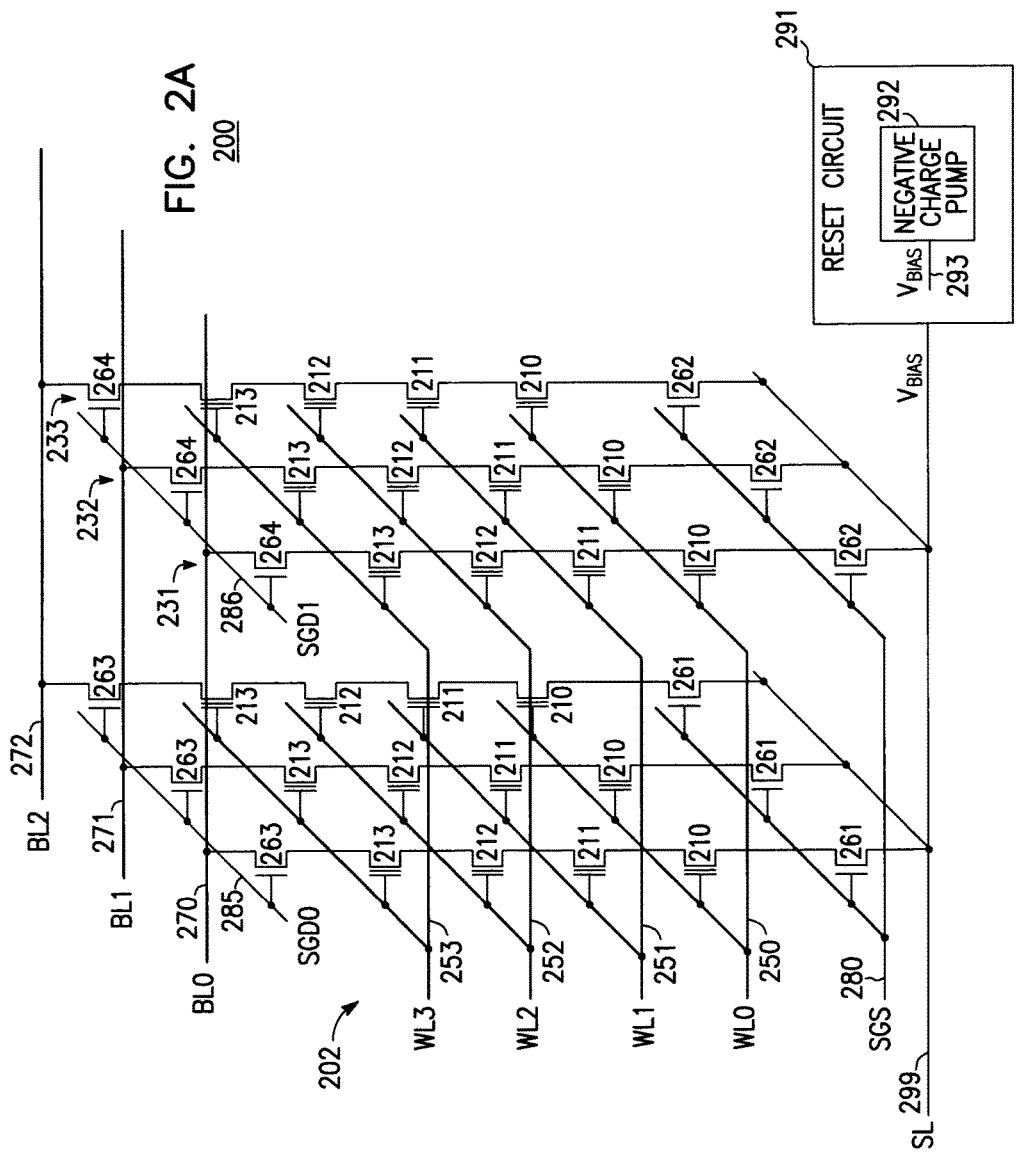
FIG. 2A shows a schematic diagram of a portion of a memory device including a reset circuit coupled to a source line of the memory device, according to an embodiment of the invention.

FIG. 2A shows a schematic diagram of a portion of a memory device 200 including reset circuit 291 coupled to a line 299 of memory device 200, according to an embodiment of the invention. Line 299 can be structured as a conductive line and can form part of a source (e.g., a source line) of memory device 200 and can carry a signal, such as signal SL (e.g., source line signal).

Memory device 200 can include control gates 250, 251, 252, and 253 that can carry corresponding signals WL0, WL1, WL2, and WL3. Each of control gates 250, 251, 252, and 253 can form part of a respective access line of memory device 200. Memory device 200 can include lines 270, 271, and 272 that carry signals BL0, BL1, and BL2, respectively. Each of lines 270, 271, and 272 can be structured as a conductive line and can form part of a respective data line of memory device 200. FIG. 2A shows four control gates 250, 251, 252, and 253 and three lines 270, 271, and 272 as an example. The number of such control gates and lines can vary.

Memory device 200 can include a memory array 202 having memory cells 210, 211, 212, and 213, and transistors (e.g., select transistors) 261, 262, 263, and 264. Memory cells 210, 211, 212, and 213 and transistors 261, 262, 263, and 264 can be arranged in memory cell strings, such as memory cell strings 231, 232, and 233. For simplicity, in FIG. 2A, only three of the memory cell strings are labeled (231, 232, and 233). Each memory cell string can be coupled between line 299 and one of lines 270, 271, and 272. For example, memory cell string 231 can include memory cells 210, 211, 212, and 213, and transistors 262 and 264 coupled between line 299 and line 270.

FIG. 2A shows an example of six memory cell strings and four memory cells 210, 211, 212, and 213 in each memory cell string. The number of such memory cell strings and number of such memory cells in each memory cell string can vary.

As shown in FIG. 2A, transistors 261 and 262 can share the same gate 280. Gate 280 can form part of a select line (e.g., source select line) of memory device 200. Transistors 261 and 262 can be controlled (e.g., turned on or turned off) by the same signal, such as an SGS signal (e.g., source select gate signal) associated with gate 280. During a memory operation, such as a read or write operation, transistors 261 and 262 can be turned on (e.g., by activating an SGS signal) to couple the memory cell strings of memory device 200 to a line 299. Transistors 261 and 262 can be turned off (e.g., by deactivating the SGS signal) to decouple the memory cell strings of memory device 200 from line 299.

Transistors 263 and 264 can include separate gates (e.g., drain select gates) 285 and 286. However, transistors 263 can share the same gate 285. Transistors 264 can share the same gate 286. Each of gates 285 and 286 can form part of a respective select line (e.g., drain select line) of memory device 200.

Transistors 263 and 264 can be controlled (e.g., turned on or turned off) by corresponding SGD0 and SGD1 (e.g., drain select gate signals) in order to selectively couple the memory cell strings of memory device 200 to their respective lines 270, 271, and 272, during a memory operation, such as a read or write operation. For example, during a memory operation, the SGD1 signal can be activated to couple memory cell string 231 to line 270. The SGD0 signal can be deactivated to decouple the other memory cell strings from line 270. During a memory operation (e.g., a read or write operation), only one of the SGD0 and SGD1 signals can be activated at a time.

Reset circuit 291 can include a negative charge pump 292 having an output 293. Negative charge pump 292 can generate a negative voltage in the form of a signal $V_{BIAS}$ provided at output 293. During a memory operation (e.g., read, write, or erase operation) of memory device 200, reset circuit 291 can operate to couple signal $V_{BIAS}$ from output 293 of negative charge pump 292 to a conductive path that includes at least a portion of line 299. FIG. 2A shows negative charge pump 292 being part of reset circuit 291 as an example. Negative charge pump 292, however, can be separated from reset circuit 291.

Memory cells 210, 211, 212, and 213 can be physically located in multiple levels of memory device 200, such that memory cells 210, 211, 212, and 213 in the same memory cell string can be stacked over each other in multiple levels of memory device 200.

Figure 2B:
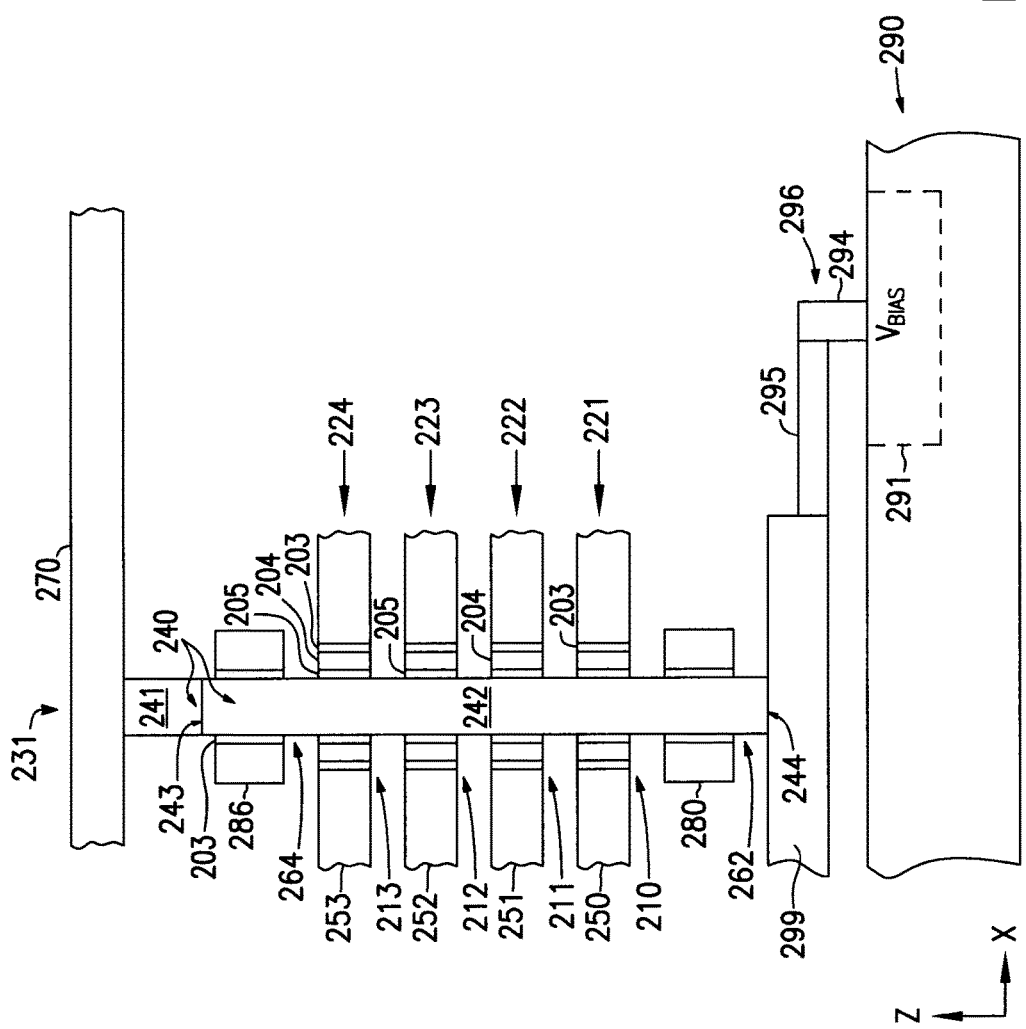
FIG. 2B shows a side view of a structure of a portion of the memory device of FIG. 2A including charge blocking materials, charge storage materials (e.g., floating gate type materials), and tunnel dielectric materials being separated among memory cells, and a source line formed over a substrate, according to an embodiment of the invention.

FIG. 2B shows a side view of a structure of a portion of memory device 200 of FIG. 2A, according to an embodiment of the invention. As shown in FIG. 2B, memory device 200 can include a substrate 290 where memory cell string 231 can be formed over substrate 290. Substrate 290 can include a monocrystalline (also referred to as single-crystal) semiconductor material. For example, substrate 290 can include monocrystalline silicon (also referred to as single-crystal silicon). The monocrystalline semiconductor material of substrate 290 can include impurities, such that substrate 290 can have a specific conductivity type (e.g., n-type or p-type).

As shown in FIG. 2B, memory cells 210, 211, 212, and 213 can be located in different levels 221, 222, 223, and 224, respectively, in a z-direction of device 200. The z-direction can extend in a direction associated with the thickness of substrate 290. FIG. 2B also shows an x-direction, which is perpendicular to the z-direction.

Memory cell string 231 can include a body 240 having a portion 241 coupled to line 270 and a portion 242 coupled to line 299. Body 240 can include a conductive material that is capable of providing a conduction of current between lines 270 and 299. Portions 241 and 242 can include materials of different conductivity types. For example, portion 241 can include a semiconductor material of n-type, and portion 242 can include a semiconductor material of p-type. The semiconductor material can include polycrystalline silicon.

Control gates 250, 251, 252, and 253 can be located along at least a portion (e.g., portion 242) of body 240 in the z-direction. The materials of control gates 250, 251, 252, and 253 can include a conductive material (e.g., conductively doped polycrystalline silicon or other conductive material).

Memory cell string 231 can include materials 203, 204, 205 between a portion of body 240 and each of control gates 250, 251, 252, and 253. Material 203 can also be between body 240 and each of gates (e.g., select gates) 280 and 286. As shown in FIG. 2B, materials 203, 204, and 205 can be separated among memory cells 210, 211, 212, and 213.

Material 203 can include a charge blocking material(s) (e.g., a dielectric material such as silicon nitride) that is capable of blocking a tunnel of a charge.

Material 204 can include a charge storage material(s) that can provide a charge storage function to represent a value of information stored in memory cell 210, 211, 212, and 213. For example, material 204 can include conductively doped polycrystalline silicon, which can be either a p-type polycrystalline silicon or an n-type polycrystalline silicon. The polycrystalline silicon can be configured to operate as a floating gate (e.g., to store charge) in a memory cell (e.g., a memory cell 210, 211, 212, or 213).

Material 205 can include a tunnel dielectric material(s) (e.g., an oxide of silicon) that is capable of allowing tunneling of a charge (e.g., electrons).

Line 299 can be formed over a portion of substrate 290. Line 299 and portion 242 of body 240 can include materials of different conductivity types. For example, line 299 can include a semiconductor (e.g., polycrystalline silicon) material of n-type, and portion 242 can include a semiconductor (polycrystalline silicon) material of p-type. Line 299 and portion 241 of body 240 can include materials of the same conductivity type (e.g., polycrystalline silicon of n-type).

As shown in FIG. 2B, portions 241 and 242 can contact each other and form a junction (e.g., p-n junction) 243. Portion 242 and line 299 can contact each other and form a junction (e.g., p-n junction) 244.

Reset circuit 291 can be located over (e.g., formed in or formed on) a portion of substrate 290. Memory device 200 can include conductive segments 294 and 295 coupled to reset circuit 291 and line 299. Memory device 200 can include a conductive path 296 formed at least in part by conductive segments 294 and 295 and by at least a portion of line 299. During part of a memory operation (e.g., read, write, or erase operation) of memory device 200, reset circuit 291 can operate to couple output 293 (FIG. 2A) of negative charge pump 292 to at least a portion (e.g., portion 242 in FIG. 2B) of the body 240 through conductive path 296. The negative voltage provided by signal $V_{BIAS}$ at output 293 can be applied to at least a portion of body 240 through conductive path 296. FIG. 2B shows an example structure of conductive 296. Other structures of conductive path 296 can formed.

Figure 2C:
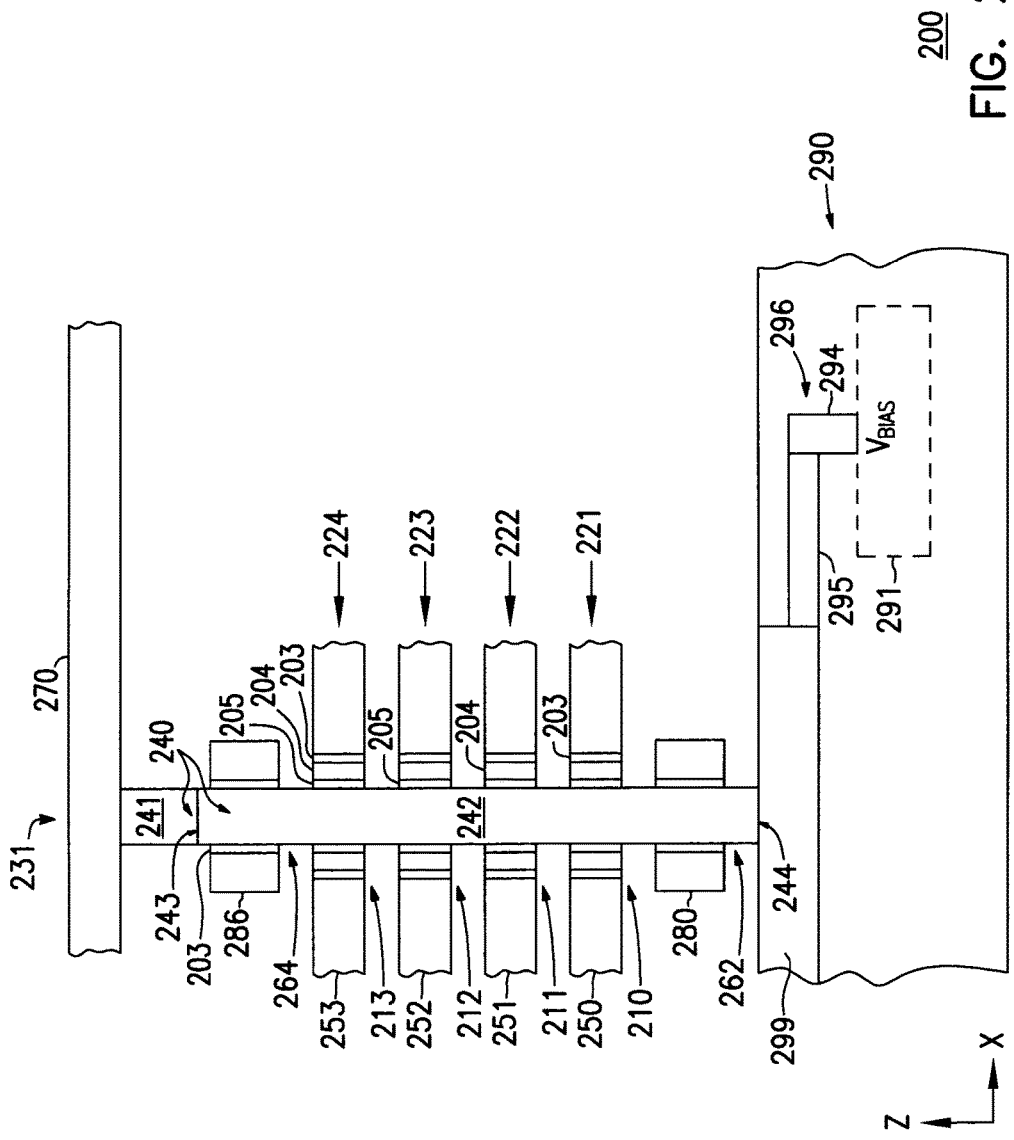
FIG. 2C shows a variation of the memory device of FIG. 2B including a source line formed in a substrate, according to an embodiment of the invention.

FIG. 2C shows a variation of memory device 200 of FIG. 2B according to an embodiment of the invention. As shown in FIG. 2B, line 299 can be formed in a portion of substrate 290.

Figure 2D:
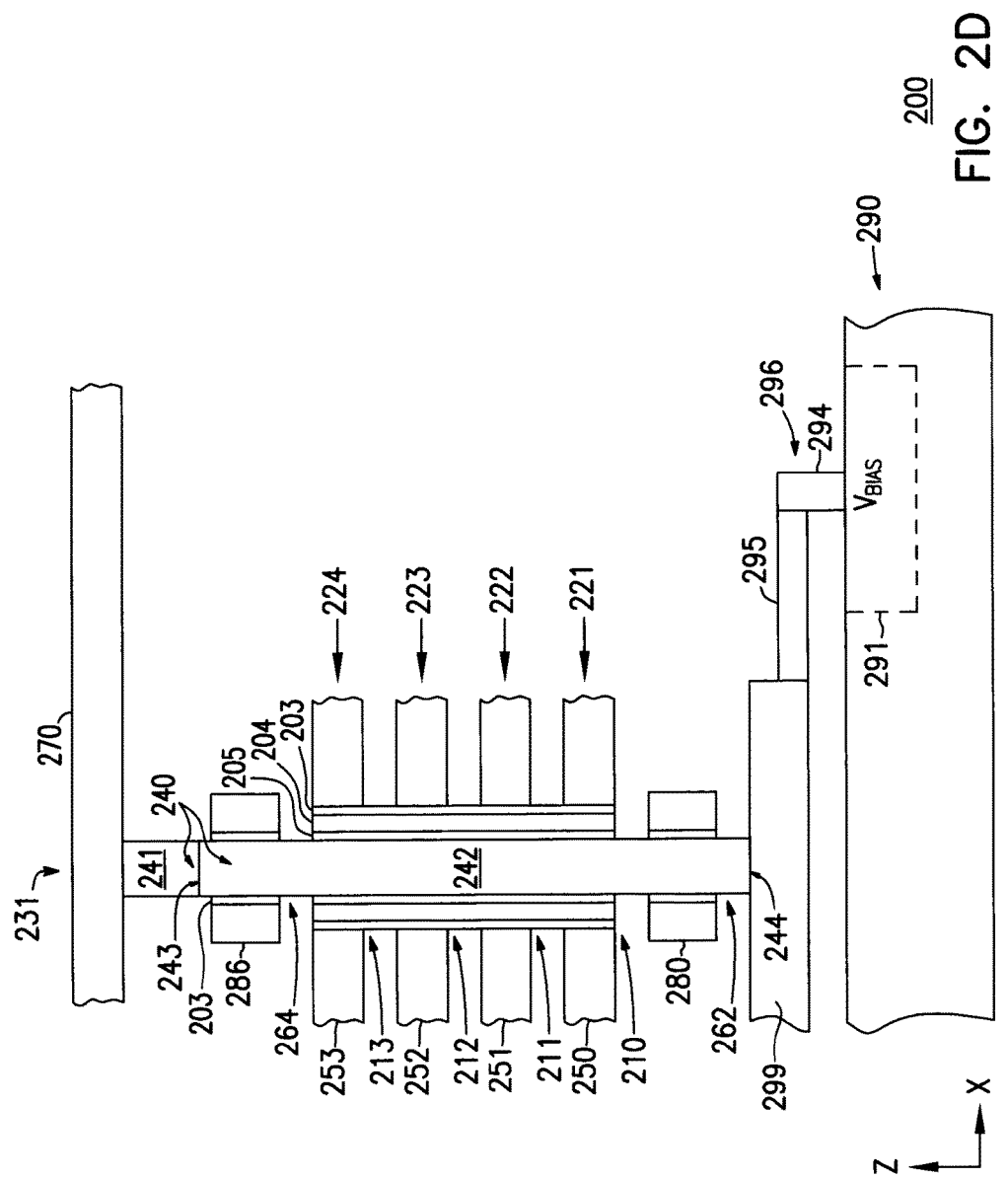
FIG. 2D shows a side view of a structure of a portion of the memory device of FIG. 2A including charge blocking materials, charge storage materials (e.g., charge trap type materials), and tunnel dielectric materials being separated among memory cells, and a source line formed over a substrate, according to an embodiment of the invention.

FIG. 2D shows a variation of memory device 200 of FIG. 2B according to an embodiment of the invention. As shown in FIG. 2C, materials 203, 204, and 205 are not separated (e.g., continuous) among memory cells 210, 211, 212, and 213. Material 204 can be different from that of material 204 of FIG. 2B. For example, material 204 of FIG. 2D can include charge trapping materials, such as silicon nitride.

Figure 2E:
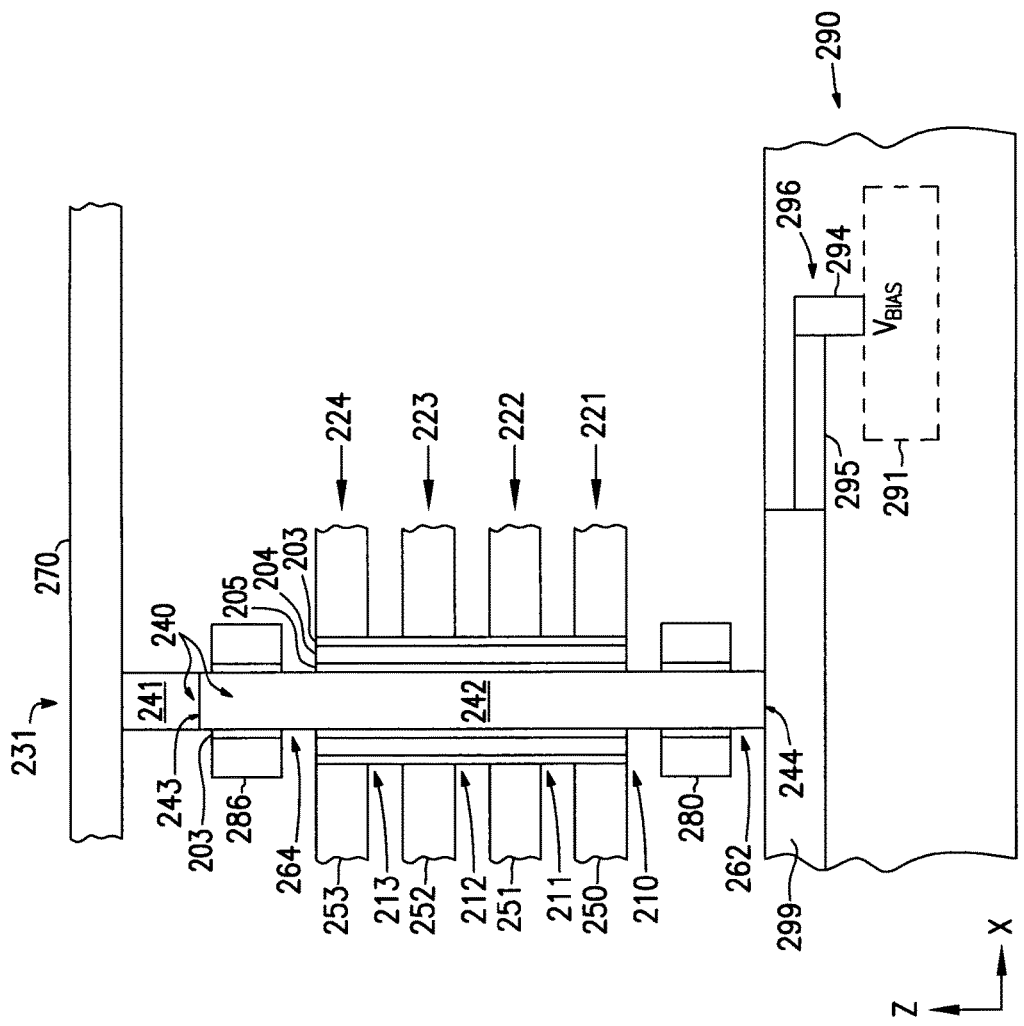
FIG. 2E shows a variation of the memory device of FIG. 2D including a source line formed in a substrate, according to an embodiment of the invention.

FIG. 2E shows a variation of memory device 200 of FIG. 2D according to an embodiment of the invention. As shown in FIG. 2E, line 299 can be formed in a portion of substrate 290.

Figure 3A:
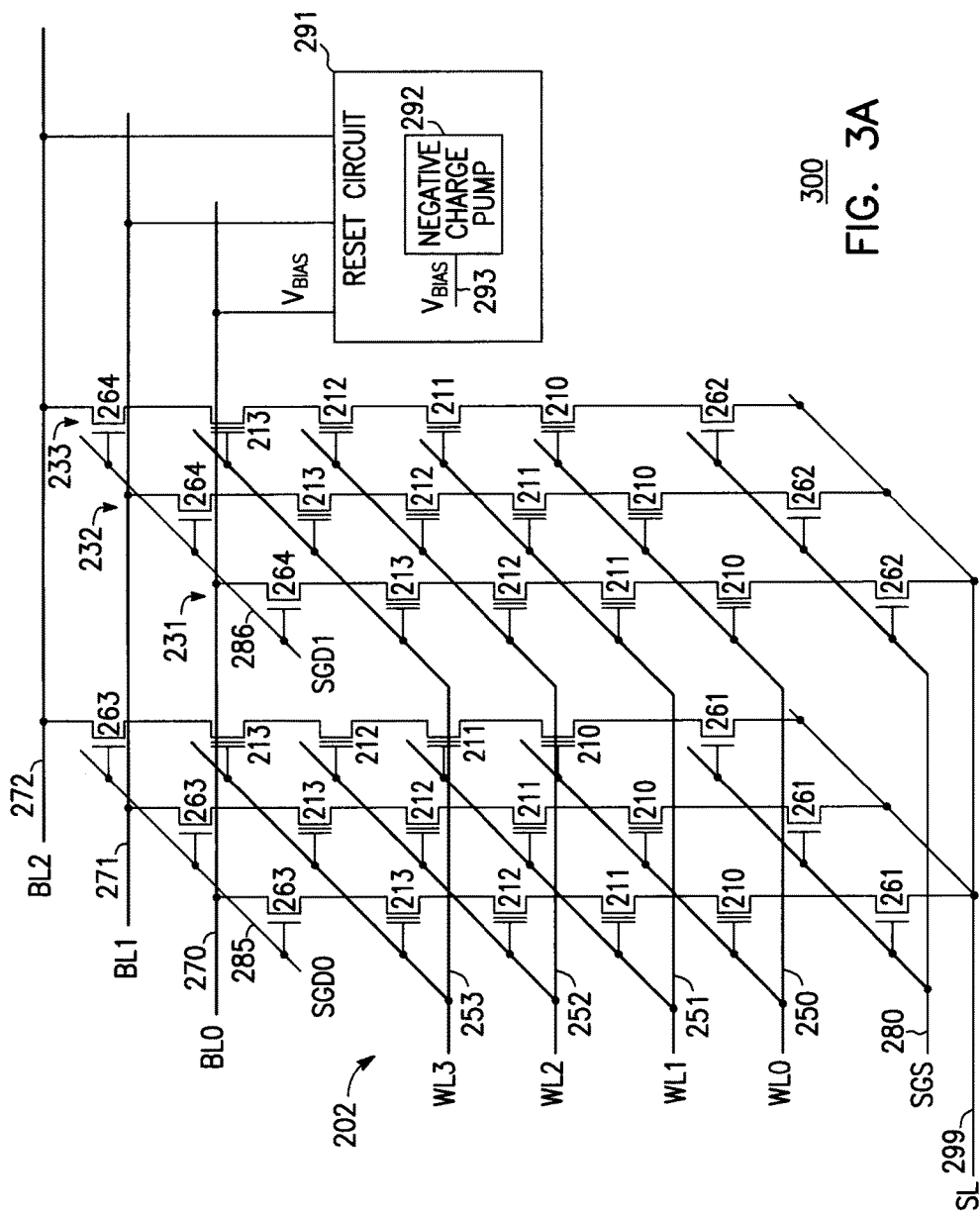
FIG. 3A shows a schematic diagram of a portion of a memory device including a reset circuit coupled to a data line of the memory device, according to an embodiment of the invention.

FIG. 3A shows a schematic diagram of a portion of a memory device 300 including reset circuit 291 coupled to a data lines 270, 271, and 272 of memory device 300, according to an embodiment of the invention. Memory device 300 can be a variation of memory device 200 of FIG. 2A. As shown in FIG. 3A, memory device 300 can include elements similar to or identical to those of memory device 200 of FIG. 2A. Description of similar to or identical elements between memory devices 200 and 300 is not repeated in the description of FIG. 3A. Differences between memory devices 200 and 300 include the connections of reset circuit 291 of memory device 300 in FIG. 3A.

As shown in FIG. 3A, reset circuit 291 can be coupled to lines 270, 271, and 272. FIG. 3A shows an example of signal $V_{BIAS}$ being associated with line 270 as an example. During a memory operation (e.g., read, write, or erase operation) of memory device 300, reset circuit 291 can operate to selectively couple signal $V_{BIAS}$ from output 293 of negative charge pump 292 to any line among lines 270, 271, and 272, depending on which memory cell string is selected to store information, obtain information, or erase information during the memory operation. For example, if memory cell 210, 211, 212, or 213 of a memory cell string coupled to line 270 is selected in a memory operation (read, write, or erase operation), then reset circuit 291 can operate to couple signal $V_{BIAS}$ from output 293 of negative charge pump 292 to line 270.

Figure 3B:
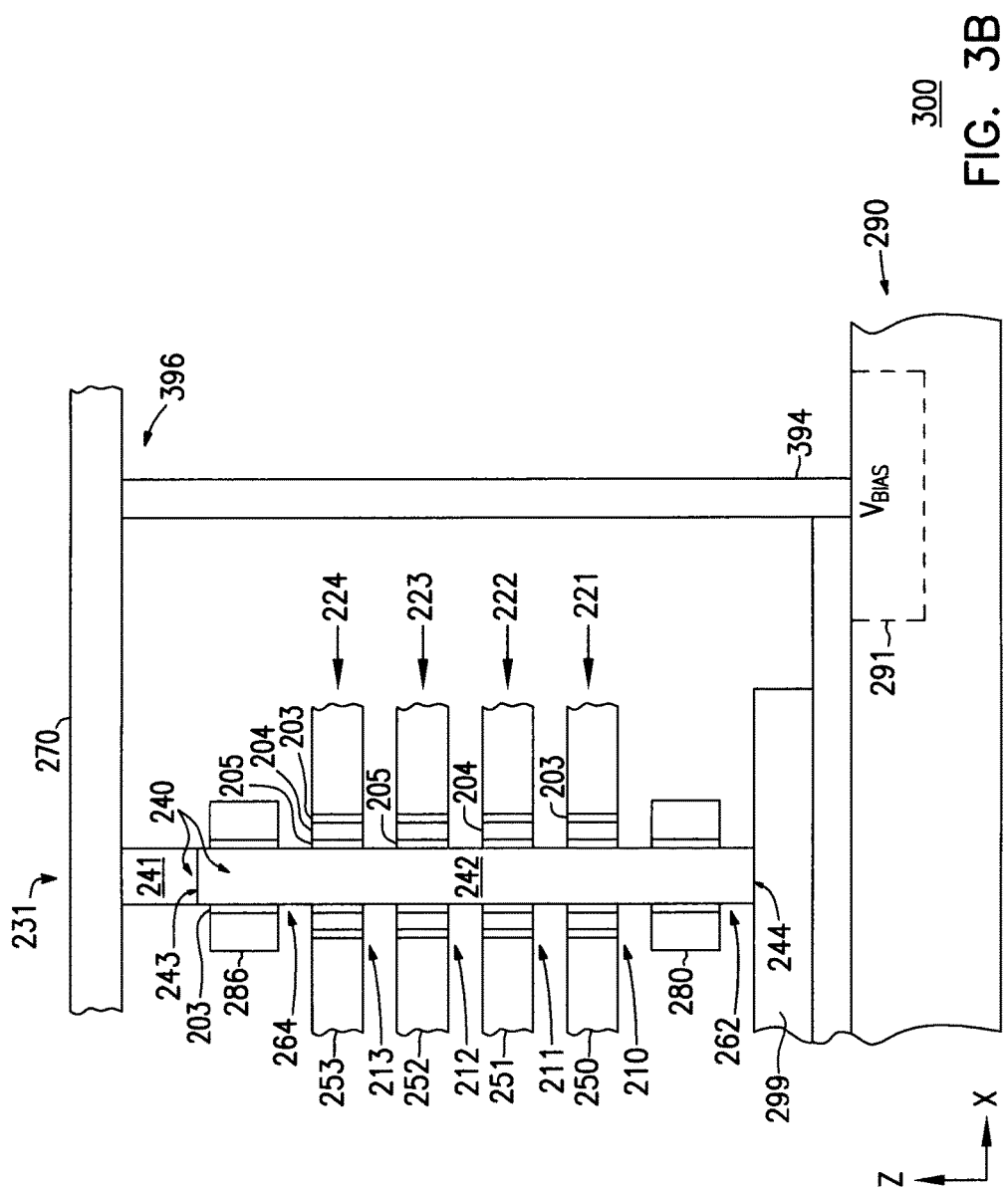
FIG. 3B shows a side view of a structure of a portion of the memory device of FIG. 3A including charge blocking materials, charge storage materials (e.g., floating gate type materials), and tunnel dielectric materials being separated among memory cells, and a source line formed over a substrate, according to an embodiment of the invention.

FIG. 3B shows a side view of a structure of a portion of the memory device 300 of FIG. 3A, according to an embodiment of the invention. As shown in FIG. 3B, memory device 300 can include elements similar to or identical to those of memory device 200 of FIG. 2B. Description of similar to or identical elements between memory devices 200 and 300 (FIG. 2B and FIG. 3B) is not repeated in the description of FIG. 3B.

As shown in FIG. 3B, memory device 300 can include a conductive segment 394 coupled to reset circuit 291 and line 270. Memory device 300 can include a conductive path 396 that can be formed at least in part by conductive segment 394 and by at least a portion of line 270. During part of a memory operation (e.g., read, write, or erase operation) of memory device 300, reset circuit 291 can operate to couple output 293 (FIG. 3A) of negative charge pump 292 to at least a portion (e.g., portion 241 in FIG. 3B) of the body 240 through conductive path 396. The negative voltage provided by signal $V_{BIAS}$ can be applied to at least a portion of body 240 through conductive path 396. FIG. 3B shows an example structure of conductive path 396. Other structures of conductive path 396 can formed.

Figure 3C:
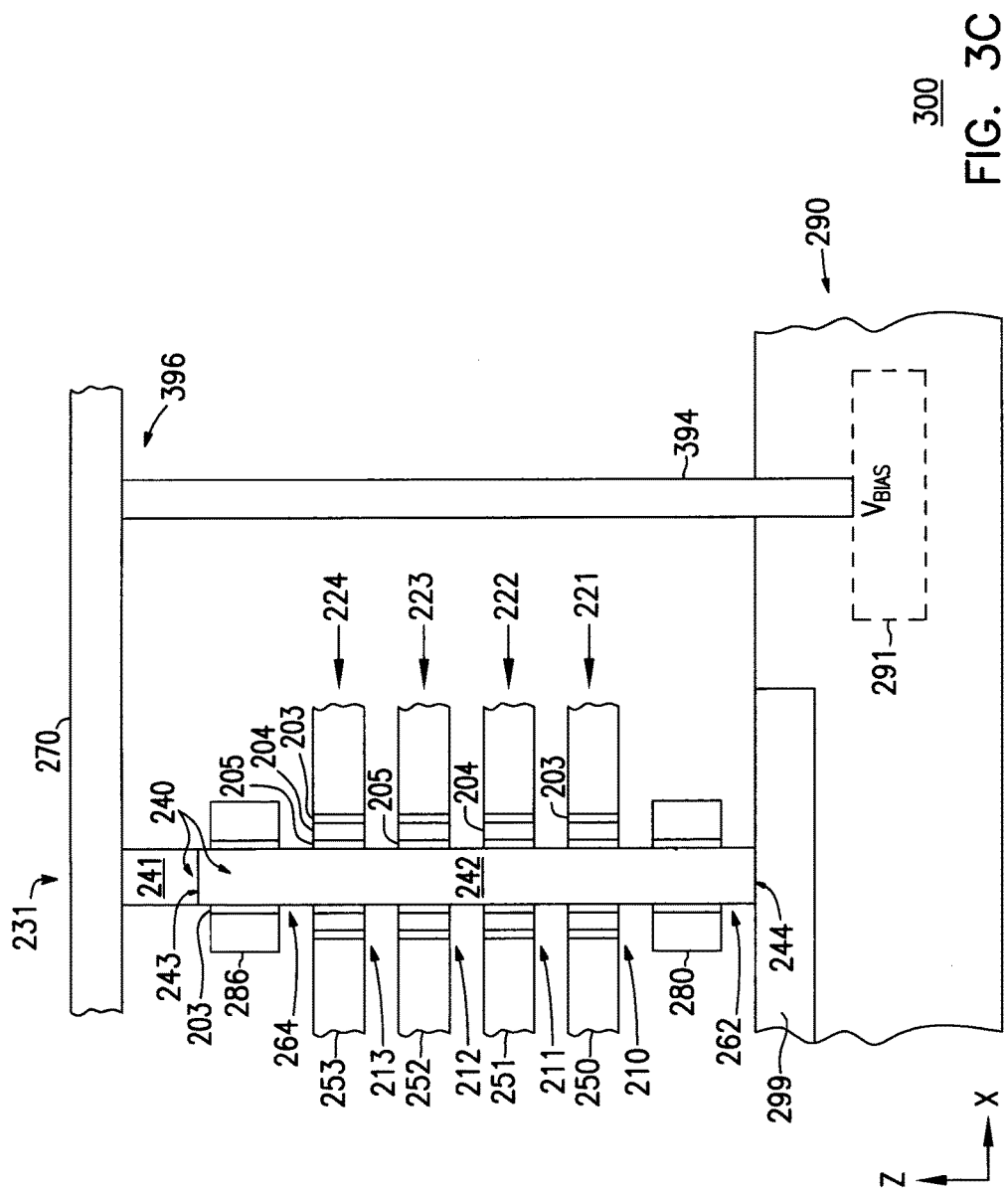
FIG. 3C shows a variation of the memory device of FIG. 3B including a source line formed in a substrate, according to an embodiment of the invention.

FIG. 3C shows a variation of memory device 300 of FIG. 3B according to an embodiment of the invention. As shown in FIG. 3B, line 299 can be formed in a portion of substrate 290.

Figure 3D:
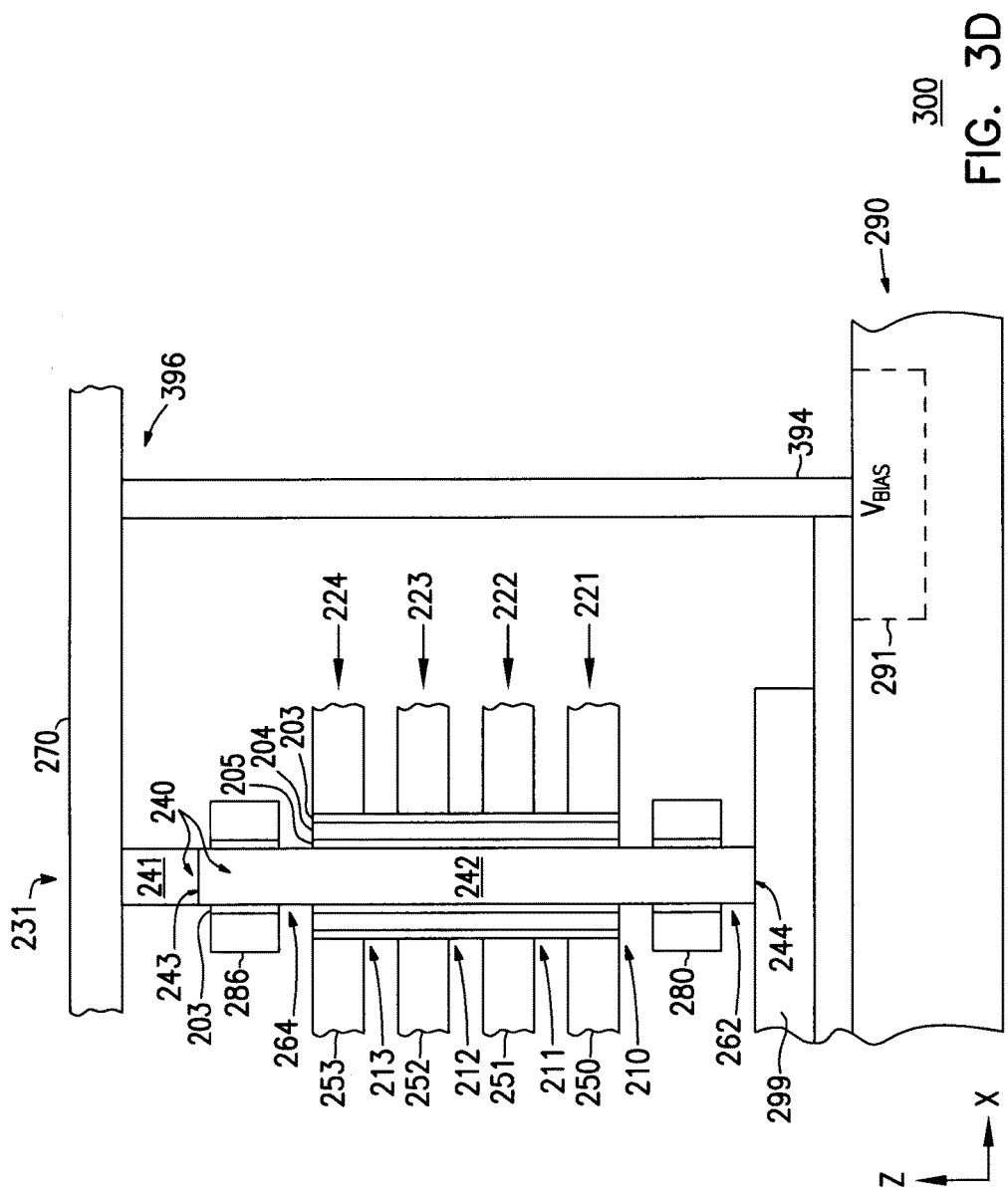
FIG. 3D shows a side view of a structure of a portion of the memory device of FIG. 3A including charge blocking materials, charge storage materials (e.g., charge trap type materials), and tunnel dielectric materials being separated among memory cells, and a source line formed over a substrate, according to an embodiment of the invention.

FIG. 3D shows a variation of memory device 300 of FIG. 3B according to an embodiment of the invention. As shown in FIG. 3C, materials 203, 204, and 205 are not separated (e.g., continuous) among memory cells 210, 211, 212, and 213. Material 204 can be different from that of material 204 of FIG. 3B. For example, material 204 of FIG. 3D can include charge trapping materials, such as silicon nitride.

FIG. 3E shows a variation of memory device 300 of FIG. 3D according to an embodiment of the invention. As shown in FIG. 3E, line 299 can be formed in a portion of substrate 290.

Figure 4:
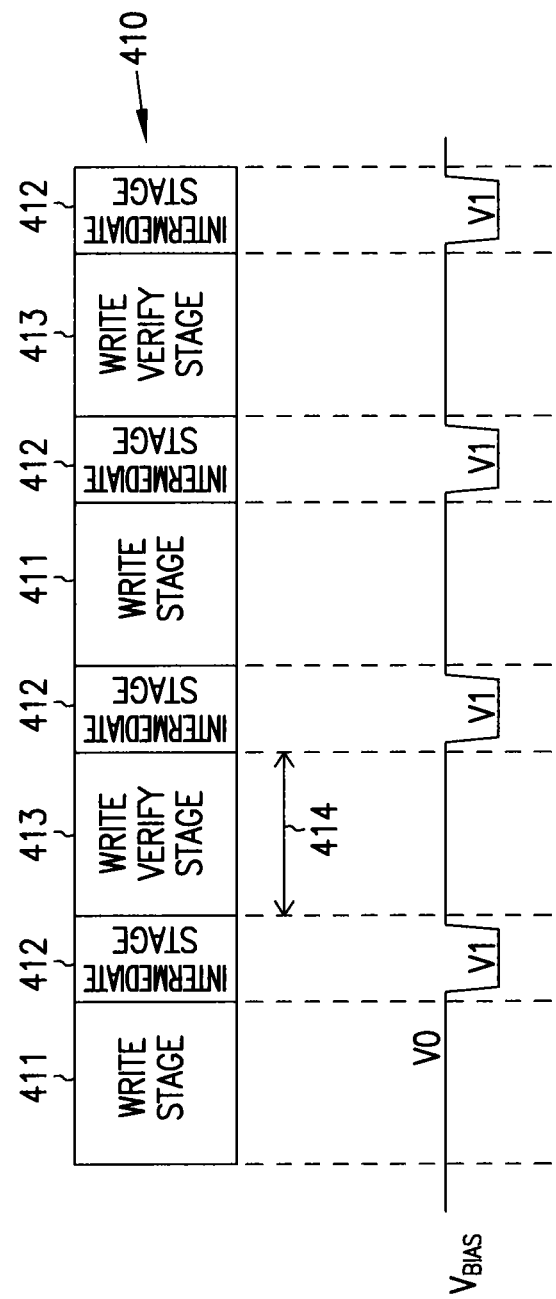
FIG. 4 shows a diagram illustrating different stages of a write operation of the memory device of FIG. 2A and FIG. 2B, according to an embodiment of the invention.

FIG. 4 shows a diagram illustrating different stages 411, 412, and 413 of a write operation 410 of memory device 200 of FIG. 2A and FIG. 2B and memory device 300 of FIG. 3A and FIG. 3B, according to an embodiment of the invention. The following description refers to FIG. 2A, FIG. 2B, FIG. 3A, FIG. 3B, and FIG. 4.

During stage (e.g., write stage) 411 of write operation 410 in FIG. 4, memory devices 200 and 300 can store information in a selected memory cell among memory cells 210, 211, 212, and 213 of a memory cell string, such as memory cell string 231. During stage (e.g., write verify stage) 413 of write operation 410 in FIG. 4, memory devices 200 and 300 can determine whether the value of information stored in the selected memory cell (stored by stage 411) reaches a target value. The target value refers to a value of information intended to be stored in a selected memory cell. The value of information stored in a selected memory cell can be based on a state (e.g., threshold voltage) of the selected memory cell.

Stage (e.g., intermediate stage) 412 of write operation 410 in FIG. 4 can be performed during a time interval between stages 411 and 413. During stage 412, memory devices 200 and 300 can apply a negative voltage to a body of a memory cell string, such as body 240 of memory cell string 231 in FIG. 2B or FIG. 3B.

As shown in FIG. 4, signal $V_{BIAS}$ (from reset circuit 291 in FIG. 2A, FIG. 2B, FIG. 3A, and FIG. 3B) can be provided with a voltage V0 and a voltage V1. Voltage V0 can be zero volts. Voltage V1 can have a negative value. The negative voltage applied to body 240 (FIG. 2B and FIG. 3B) can have a value corresponding to the value of voltage V1 of signal $V_{BIAS}$.

The value of voltage V1 can be selected such that when signal $V_{BIAS}$ is applied to line 299 (through conductive path 296 in FIG. 2B), it can cause junction 244 to be in a forward bias condition, such that hole carriers can move from portion 242 to line 299 through junction 244.

The value of voltage V1 can also be selected such that when signal $V_{BIAS}$ is applied to portion 241 of body 240 (through conductive path 396 in FIG. 3B), it can cause junction 243 to be in a forward bias condition, such that hole carriers can move from portion 242 to portion 241 through junction 243.

As described above with reference to FIG. 2B, line 299 and portion 241 can include the same n-type polycrystalline silicon, portion 242 can include p-type polycrystalline silicon, and junctions 243 and 244 can be p-n junctions. Thus, the value of voltage V1 can be selected to be less than a negative built-in potential of junction 243 or junction 244, so that junction 243 or 244 can be in a forward bias condition when signal $V_{BIAS}$ is applied. For example, voltage V1 can have a value of approximately −0.8 volts (V) or less (e.g., −1V, −2V, −3V, or other values) to cause junction 243 (or junction 244) to be in a forward bias condition when signal $V_{BIAS}$ is applied to line 299 (or to portion 241).

Reset circuit 291 (FIG. 2B and FIG. 3B) can apply signal $V_{BIAS}$ to body 240 during stage 412 (FIG. 4). Reset circuit 291 can decouple signal $V_{BIAS}$ from body 240 (in other words, not apply signal $V_{BIAS}$ to body 240) during other stages of write operation 410, such as during stages 411 and 413.

FIG. 4 shows write operation 410 including two of each of stages 411, 412, and 413 as an example. The number of these stages may vary, depending on when the value of information stored in the selected memory cell (stored by stage 411) reaches a target value during write operation 410. For example, if results from stage 413 (performed during time interval 414) indicate that the value of information stored in the selected memory cell (stored by stage 411) reaches a target value, then write operation 410 on that selected memory cell can end after time interval 414 without performing an additional stage 411, 412, or 413. Alternatively, before it ends the write operation on the selected memory cell, write operation 410 can perform one additional stage 412 after the value of information stored in the selected memory cell reaches a target value during time interval 414.

In another example, if results from stage 413 (performed during time interval 414) indicate that the value of information stored in the selected memory cell (stored by stage 411) has not reached a target value, then write operation 410 for that selected memory cell can continue. Memory devices 200 and 300 can repeat the process and perform additional stages 411, 412, and 413 until the value of information stored in the selected memory cell (stored by stage 411) reaches a target value. Thus, in the same write operation 410, a negative voltage can be applied to a body of a memory cell string after and before time interval 414. For example, as shown in FIG. 4, stage 412 performed before time interval 414 can apply a negative voltage (e.g., voltage V1 provided by signal $V_{BIAS}$) to a body of a memory cell string after information is stored in a selected memory cell of the memory cell string by stage 411 (performed before time interval 414). Another stage 412 (performed after time interval 414) can apply another negative voltage (e.g., voltage V1 provided by signal $V_{BIAS}$) to the body of the memory cell string before information is stored in the selected memory cell by another stage 411 (performed after time interval 414).

Figure 5:
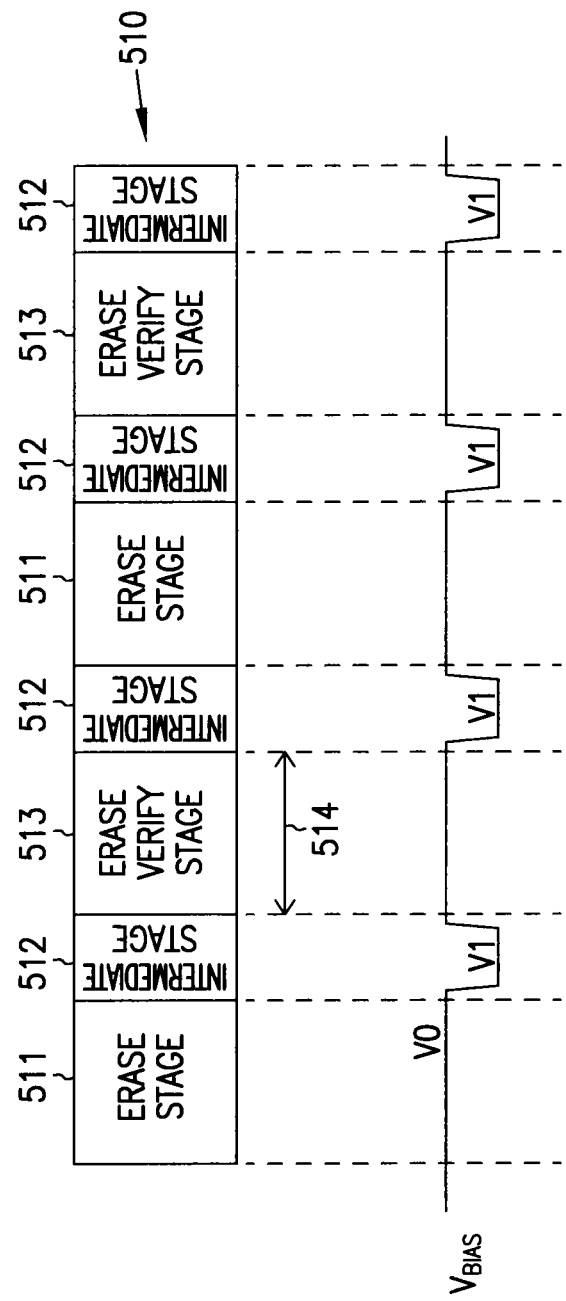
FIG. 5 shows a diagram illustrating different stages of an erase operation of the memory device of FIG. 2A and FIG. 2B, according to an embodiment of the invention.

FIG. 5 shows a diagram illustrating different stages 511, 512, 513 of an erase operation 510 of memory device 200 of FIG. 2A and FIG. 2B and memory device 300 of FIG. 3A and FIG. 3B, according to an embodiment of the invention. During stage (e.g., an erase stage) 511 of erase operation 510 of FIG. 5, memory devices 200 and 300 can erase information from a selected memory cell (which could include all memory cells from a block) among 210, 211, 212, and 213 of a memory cell string, such as memory cell string 231. During stage (e.g., erase verify stage) 513 of erase operation 510 of FIG. 5, memory devices 200 and 300 can determine whether the state (e.g., threshold voltage) of the selected memory cell is within a target value range (e.g., less than a target value). Here, the target value range can include a predetermined range of voltages.

Stage (e.g., intermediate stage) 512 of erase operation 510 in FIG. 5 can be performed during a time interval between stages 511 and 513. During stage 512, memory devices 200 and 300 can apply a negative voltage to a body of a memory cell string, such as body 240 of memory cell string 231 in FIG. 2B or FIG. 3B.

In FIG. 5, signal $V_{BIAS}$ (from reset circuit 291 in FIG. 2A, FIG. 2B, FIG. 3A, and FIG. 3B) can be provided with voltages V0 and V1, which can be similar to or identical to that of signal $V_{BIAS}$ during write operation 410 of FIG. 4.

Reset circuit 291 (FIG. 2B and FIG. 3B) can apply signal $V_{BIAS}$ to body 240 during stage 512 of erase operation 510 (FIG. 5). Reset circuit 291 can decouple signal $V_{BIAS}$ from body 240 (in other words, not apply signal $V_{BIAS}$ to body 240) during other stages of erase operation 510, such as during stages 511 and 513.

FIG. 5 shows erase operation 510 including two of each of stages 511 and 513 as an example. The number of these stages may vary, depending on when the state of the selected memory cell is within a target value range during erase operation 510. For example, if results from stage 513 (performed during time interval 514) indicate that the state of the selected memory cell(s) is within a target value range, then erase operation 510 for that selected memory cell(s) can end after time interval 514 without performing an additional stage 511, 512, or 513. Alternatively, before it ends the erase operation on the selected memory cell, erase operation 510 can perform one additional stage 512 after the state of the selected memory cell is within a target value range during time interval 514.

In another example, if results from stage 513 (performed during time interval 514) indicate that the state of the selected memory cell(s) is not within a target value range, then erase operation 510 on that selected memory cell(s) can continue. Memory devices 200 and 300 can repeat the process and perform additional stages 511, 512, and 513 until the state of the selected memory cell is within a target value range. Thus, in the same erase operation 510, a negative voltage can be applied to a body of a memory cell string after and before time interval 514. For example, as shown in FIG. 5, stage 512 performed before time interval 514 can apply a negative voltage (e.g., voltage V1 provided by signal $V_{BIAS}$) to a body of a memory cell string after information is erased in a selected memory cell of the memory cell string by stage 511 (performed before time interval 514). Another stage 512 (performed after time interval 514) can apply another negative voltage (e.g., voltage V1 provided by signal $V_{BIAS}$) to the body of the memory cell string before information is erased from the selected memory cell by another stage 511 (performed after time interval 514).

Memory devices 200 and 300 may have improved operations such as write operation 410 (FIG. 4) and erase operation 510 (FIG. 5). For example, during at least one stage (e.g., stage 411, 413, or both) of write operation 410, excess majority carriers (e.g., holes) may be generated and may accumulate in a part of body 240 (FIG. 2B and FIG. 3B), such as in parts of portion 242 near junctions 243 and 244. During at least one stage (e.g., stage 511, 513, or both) of erase operation 510 (FIG. 5), excess majority carriers (e.g., holes) may also be generated (e.g., by gate-induced drain leakage) and may accumulate in a part of body 240, such as in parts of portion 242 near junctions 243 and 244. Such excess majority carriers in the write and erase operations may affect (e.g., shift) the threshold voltage of memory cells 210, 211, 212, and 213 after information is stored in memory cells 210, 211, 212, and 213 (e.g., stored by stage 411 in FIG. 4) or after information is erased from memory cells 210, 211, 212, and 213 (e.g., erased by stage 511 in FIG. 5). Applying a negative voltage (e.g., through signal $V_{BIAS}$) to body 240 of a memory cell string of memory devices 200 and 300, as described above, can attract the excess majority carriers and cause them to move out of portion 242 of body 240 and into line 299 (FIG. 2B) or into portion 241 (FIG. 3B). This may reduce the affect of excess majority carriers on the threshold voltage of memory cells of the memory cell string. Therefore, performance of at least part of the write and erase operations of memory devices 200 and 300 (stage 413 in FIG. 4 or stage 513 in FIG. 5) may be improved (e.g., more reliable).

Figure 6:
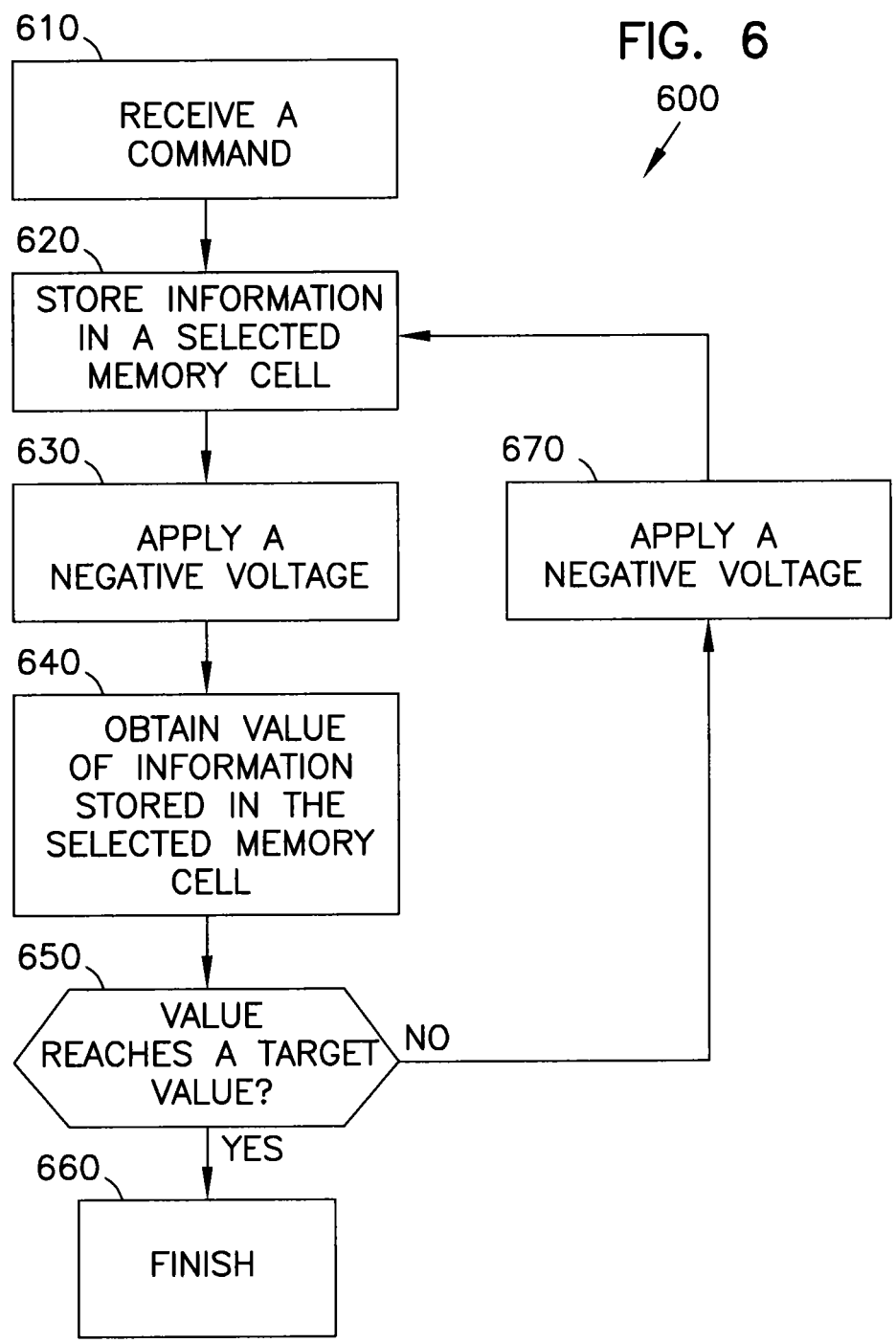
FIG. 6 is flow diagram for a method of performing a write operation in a memory device, according to an embodiment of the invention.

FIG. 6 is flow diagram for a method 600 of performing a write operation in a memory device, according to an embodiment of the invention. Method 600 can be used in a memory device such as memory device 100 (FIG. 1), memory device 200 (FIG. 2A and FIG. 2B), and memory device 300 (FIG. 3A and FIG. 3B).

As shown in FIG. 6, activity 610 of method 600 can include receiving a command (e.g., a write command) to perform a write operation on a selected memory cell among memory cells of a memory string of the memory device. The selected memory cell can include one of memory cell 210, 211, 212, and 213 of memory cell string 231 of memory device 200 (FIG. 2A and FIG. 2B) or memory device 300 (FIG. 3A and FIG. 3B). The command received in activity 610 can be provided to the memory device by a memory controller or a processor external to the memory device.

Activity 620 of method 600 can include storing information in the selected memory cell. Activity 620 can be performed during a stage (e.g., write stage) similar to stage 411 of FIG. 4. Storing the information in activity 620 can include causing the selected memory cell to hold a state (e.g., a threshold voltage) having a value to reflect the value of information stored in the selected memory cell.

Activity 630 of method 600 can include applying a negative voltage to a body of the memory cell string that includes the selected memory cell. The body of the memory cell string can be similar to body 240 of memory cell string 231 of FIG. 2B or FIG. 3B. Activity 630 can be performed during a stage (e.g., intermediate stage) similar to stage 412 of FIG. 4. In activity 630, the negative voltage can be provided by a signal, such as signal $V_{BIAS}$ of FIG. 2A, FIG. 3A, and FIG. 4. The negative voltage can be applied to the body of the memory cell string through least a portion of a source (e.g., a portion of line 299 in FIG. 2A and FIG. 2B) coupled to the body of the memory cell string. Alternatively, in activity 630, the negative voltage can be applied to the body of the memory cell string through least a portion of a data line (e.g., a portion of line 270, 271, or 272 in FIG. 3A and FIG. 3B) coupled to the body of the memory cell string.

Method 600 can include activities 640 and 650 for determining whether a value of the information stored in the selected memory cell reaches a target value. Activities 640 and 650 can be performed during a stage (e.g., write verify stage) similar to stage 413 of FIG. 4. As shown in FIG. 6, activity 640 can include obtaining the value of the information stored in the selected memory cell. For example, activity 640 can sense the threshold voltage of the memory cell to obtain the value of the information stored in the selected memory cell. Activity 650 can compare the obtained value of the information with the target value. The obtained value of the information is based in part on a threshold voltage of the selected memory cell. Based on results from the comparison, activity 650 can determine whether the value of the information stored in the selected memory cell reaches the target value.

For example, if the value of the obtained value exceeds the target value, then activity 650 can determine that the value of the information stored in the selected memory cell has reached the target value. In this case, method 600 can continue with activity 660 to finish the write operation performed on the selected memory cell.

In another example, if the obtained value of the information is less than the target value, then activity 650 can determine that the value of the information stored in the selected memory cell has not reached the target value. In this case, method 600 can continue with activity 670 (which is the same as activity 630) and apply the negative voltage (e.g., for a second time) to the body of the selected memory cell. Then, method 600 may repeat one or more of activities 620, 630, 640, 650, and 670 until the value of information stored in the selected memory cell reaches the target value.

Figure 7:
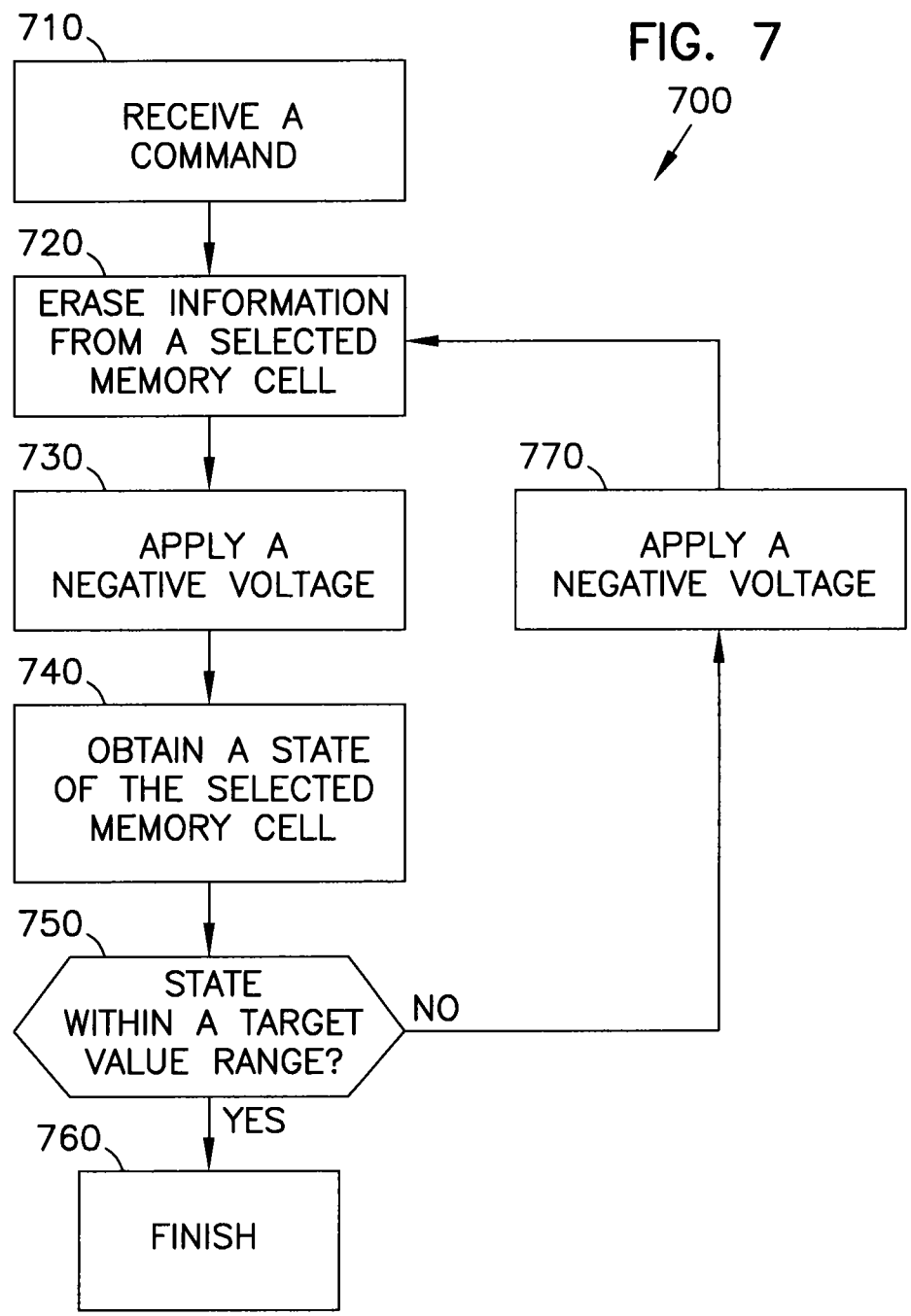
FIG. 7 is flow diagram showing a method of performing an erase operation in a memory device, according to an embodiment of the invention.

FIG. 7 is flow diagram for a method 700 of performing an erase operation in a memory device, according to an embodiment of the invention. Method 700 can be used in a memory device such as memory device 100 (FIG. 1), memory device 200 (FIG. 2A and FIG. 2B), and memory device 300 (FIG. 3A and FIG. 3B).

As shown in FIG. 7, activity 710 of method 700 can include receiving a command (e.g., an erase command) to perform an erase operation on a selected memory cell of a memory cell string of the memory device. The selected memory cell string can include one of memory cell strings 231, 232, and 233 of memory device 200 (FIG. 2A and FIG. 2B) or memory device 300 (FIG. 3A and FIG. 3B). The command received in activity 710 can be provided to the memory device by a memory controller or a processor external to the memory device.

Activity 720 of method 700 can include erasing information from the selected memory cell. Activity 720 can be performed during a stage (e.g., erase stage) similar to stage 511 of FIG. 5. Erasing information in activity 720 can include causing the selected memory cell to change its state (e.g., a threshold voltage) from one state to another state (e.g., from a programmed state to an erase state). Activity 720 can include erasing information from additional memory cells concurrently with erasing information from the selected memory cell. The additional memory cells can include other memory cells included in the memory cell string or memory cells from multiple memory cell strings (e.g., from a block of memory cells). Thus, erasing information from the selected memory cell in activity 720 can be part of erasing information concurrently from multiple memory cells.

Activity 730 of method 700 can include applying a negative voltage to a body of the memory cell string. The body of the memory cell string can be similar to body 240 of memory cell string 231 of FIG. 2B or FIG. 3B. Activity 730 can be performed during a stage (e.g., intermediate stage) similar to stage 512 of FIG. 5. The negative voltage can be provided by a signal, such as signal $V_{BIAS}$ of FIG. 2A, FIG. 3A, and FIG. 5. In activity 730, the negative voltage can be applied to the body of the memory cell string through least a portion of a source (e.g., a portion of line 299 in FIG. 2A and FIG. 2B) coupled to the body of the memory cell string. Alternatively, in activity 730, the negative voltage can be applied to the body of the memory cell string through least a portion of a data line (e.g., a portion of line 270, 271, or 272 in FIG. 3A and FIG. 3B) coupled to the body of the memory cell string.

Method 700 can include activities 740 and 750 for determining whether a state of the selected memory cell is within a target value range. Activities 740 and 750 can be performed during a stage (e.g., erase verify stage) similar to stage 513 of FIG. 5. As shown in FIG. 7, activity 740 can include obtaining a state of the selected memory cell. For example, activity 740 can sense the threshold voltage of the selected memory cell. Activity 750 can compare a value of the state of the selected memory cell with a target value. The value of the state of the selected memory cell is based in part on the threshold voltage of the selected memory cell. Based on results from the comparison, activity 750 can determine whether the state of the selected memory cell is within a target value range.

For example, if the value of the state is less than the target value, then activity 750 can determine that the state of the selected memory cell is within the target value range. In this case, method 700 can continue with activity 760 to finish the erase operation performed on the selected memory cell.

In another example, if the value of the state exceeds the target value, then activity 750 can determine that the state of selected memory cell is outside the target value range. In this case, method 700 can continue with activity 770 (which is the same as activity 730) and apply the negative voltage (e.g., for a second time) to the body of the memory cell. Then, method 700 may repeat one or more of activities 720, 730, 740, 750, and 770 until the state of memory cells in the selected memory cell is within the target value range.

Figure 8:
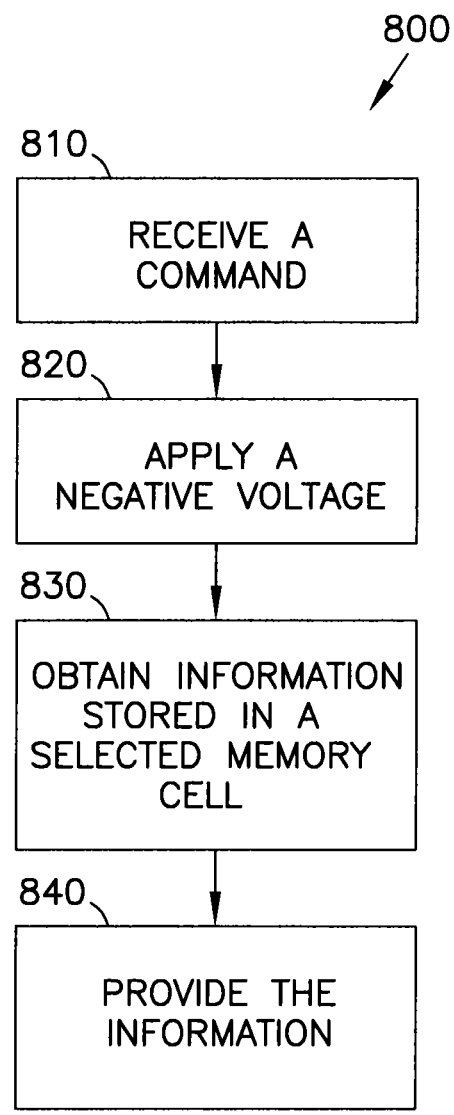
FIG. 8 is flow diagram showing a method of performing a read operation in a memory device, according to an embodiment of the invention.

FIG. 8 is flow diagram for a method 800 of performing a read operation in a memory device, according to an embodiment of the invention. Method 800 can be used in a memory device such as memory device 100 (FIG. 1), memory device 200 (FIG. 2A and FIG. 2B), and memory device 300 (FIG. 3A and FIG. 3B).

As shown in FIG. 8, activity 810 of method 800 can include receiving a command (e.g., a read command) to perform a read operation on a selected memory cell among memory cells of a memory string of the memory device. The selected memory cell can include one of memory cell 210, 211, 212, and 213 of memory cell string 231 of memory device 200 (FIG. 2A and FIG. 2B) or memory device 300 (FIG. 3A and FIG. 3B). The command received in activity 810 can be provided to the memory device by a memory controller or a processor external to the memory device.

Activity 820 of method 800 can include applying a negative voltage to at least a portion of a body of the memory cell string that includes the selected memory cell. The body of the memory cell string can be similar to body 240 of memory cell string 231 of FIG. 2B or FIG. 3B. In activity 820, the negative voltage can be provided by a signal, such as signal $V_{BIAS}$ of FIG. 2A and FIG. 3A. The negative voltage can be applied to the body of the memory cell string through at least a portion of a source (e.g., a portion of line 299 in FIG. 2A and FIG. 2B) coupled to the body of the memory cell string. Alternatively, in activity 820, the negative voltage can be applied to the body of the memory cell string through at least a portion of a data line (e.g., a portion of line 270, 271, or 272 in FIG. 3A and FIG. 3B) coupled to the body of the memory cell string.

Activity of 830 of method 800 can include obtaining information stored in the selected memory cell. Obtaining the information can include sensing a threshold voltage of the selected memory cell.

Activity of 840 of method 800 can include providing the information obtained from the selected memory cell to a component of the memory device, such as to an input/output circuit of the memory device.

The illustrations of apparatuses (e.g., memory devices 100, 200, and 300) and methods (e.g., operating methods associated with memory devices 100, 200, and 300, and methods associated with FIG. 6, FIG. 7, and FIG. 8) are intended to provide a general understanding of the structure of various embodiments and are not intended to provide a complete description of all the elements and features of apparatuses that might make use of the structures described herein. An apparatus herein refers to, for example, either a device (e.g., memory devices 100, 200, and 300) or a system (e.g., a computer, a cellular phone, or other electronic system) that includes a device such as memory devices 100, 200, and 300.

Any of the components described above with reference to FIG. 1 through FIG. 8 can be implemented in a number of ways, including simulation via software. Thus, apparatuses (e.g., memory devices 100, 200, and 300 or part of memory devices 100, 200, and 300, including control circuit 116 (FIG. 1), and reset circuit 291 (FIG. 2A, FIG. 2B, FIG. 3A, and FIG. 3B) described above may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, and 300 may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 8 include apparatuses and methods having a memory cell string that can include memory cells located in different levels of the apparatus. The memory cell string can include a body associated with the memory cells. At least one of such embodiments can include a module configured to apply a negative voltage to at least a portion of the body of the memory cell string during an operation of the apparatus. The operation can include a read operation, a write operation, or an erase operation. Other embodiments including additional apparatuses and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. A method comprising:
   storing information, during a first stage of a write operation, in a selected memory cell among memory cells of a memory cell string, the memory cells of the string formed over a substrate and located in different levels of a device in a direction perpendicular from substrate, the memory cell string including a body of the memory cells, the body of the memory cells located outside the substrate;
   determining, during a second stage of the write operation, whether a value of the information stored in the selected memory cell reaches a target value;
   applying a negative voltage to at least a portion of the body of the memory cell string during a time interval between the first and second stages of the write operation, wherein applying the negative voltage to at least the portion of the body of the memory cell string comprises applying the negative voltage through at least a portion of a source coupled to the body of the memory cell string; and
   decoupling the negative voltage from the body of the memory string in the second stage of the write operation during determining of whether the value of the information stored in the selected memory cell reaches the target value.

2. The method of claim 1, wherein the determining includes sensing the memory cell to obtain the value of the information stored in the selected memory cell, and comparing the obtained value with the target value.

3. The method of claim 2, wherein the obtained value of the information is based in part on a threshold voltage of the selected memory cell.

4. The method of claim 1, further comprising:
   applying another negative voltage to the portion of the body of the memory cell string after the second stage of the operation.

5. A method comprising:
   storing information, during a first stage of a write operation, in a selected memory cell among memory cells of a memory cell string, the memory cells of the string formed over a substrate and located in different levels of a device in a direction perpendicular from substrate, the memory cell string including a body of the memory cells, the body of the memory cells located outside the substrate;
   determining, dining a second stage of the write operation, whether a value of the information stored in the selected memory cell reaches a target value;
   applying a negative voltage to at least a portion of the body of the memory cell string during a time interval between the first and second stages, wherein applying the negative voltage to at least the portion of the body of the memory cell string comprises applying the negative voltage through at least a portion of a data line coupled to the body of the memory cell string; and
   decoupling the negative voltage from the body of the memory string in the second stage of the write operation during determining of whether the value of the information stored in the selected memory cell reaches the target value.

6. The method of claim 5, further comprising:
   repeating the storing, the determining, and the applying if the value of the information stored in the memory cell is outside a target value range.

7. The method of claim 5, wherein applying the negative voltage comprises applying a negative voltage having a value less than a negative built-in potential of a p-n junction between a first material and a second material of the body of memory cell string.

* * * * *